United States Patent
Ichinose et al.

(10) Patent No.: US 8,062,980 B2
(45) Date of Patent: Nov. 22, 2011

(54) METHOD OF FABRICATING SEMICONDUCTOR DEVICE

(75) Inventors: Daigo Ichinose, Kanagawa (JP); Tadashi Iguchi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 329 days.

(21) Appl. No.: 12/411,788

(22) Filed: Mar. 26, 2009

(65) Prior Publication Data

US 2009/0286401 A1 Nov. 19, 2009

(30) Foreign Application Priority Data

May 19, 2008 (JP) .................. 2008-130568

(51) Int. Cl.
- *C03C 15/00* (2006.01)
- *C03C 25/68* (2006.01)
- *C23F 1/00* (2006.01)
- *H01L 21/311* (2006.01)
- *H01L 21/302* (2006.01)
- *H01L 21/461* (2006.01)

(52) U.S. Cl. ............ 438/694; 216/41; 216/46; 438/696; 438/705

(58) Field of Classification Search .................. None
See application file for complete search history.

(56) References Cited

U.S. PATENT DOCUMENTS

| | | | | |
|---|---|---|---|---|
| 5,817,242 A | * | 10/1998 | Biebuyck et al. | 216/41 |
| 2006/0234165 A1 | | 10/2006 | Kamigaki et al. | |
| 2007/0049030 A1 | * | 3/2007 | Sandhu et al. | 438/689 |
| 2008/0001249 A1 | * | 1/2008 | Sheen et al. | 257/499 |
| 2008/0057692 A1 | * | 3/2008 | Wells et al. | 438/597 |

FOREIGN PATENT DOCUMENTS

JP 2006-303022 11/2006

OTHER PUBLICATIONS

Chang et al. "A simple spacer technique to fabricate poly-Si TFTs with 50 nm nanowire channels." Nov. 2007, IEEE Electron Device Letters, vol. 28 No. 11, 993-995.*

Miura et al. "Crystallization-induced stress in silicon thin films." Jun. 1, 1992 Appl. Phys. Lett., 60(22) 2746-2748.*

* cited by examiner

*Primary Examiner* — Parviz Hassanzadeh
*Assistant Examiner* — Margaret D Klunk
(74) *Attorney, Agent, or Firm* — Finnegan, Henderson, Farabow, Garrett & Dunner, L.L.P.

(57) ABSTRACT

A method of fabricating a semiconductor device according to one embodiment includes: forming a core material on a workpiece; forming a coating film comprising an amorphous material so as to cover an upper surface and side faces of the core material; crystallizing the coating film by applying heat treatment; forming a sidewall mask by removing the crystallized coating film while leaving a portion thereof located on the side faces of the core material; removing the core material after forming the sidewall mask; and etching the workpiece using the sidewall mask as a mask after removing the core material.

17 Claims, 9 Drawing Sheets

US 8,062,980 B2

METHOD OF FABRICATING SEMICONDUCTOR DEVICE

CROSS-REFERENCE TO RELATED APPLICATIONS

This application is based upon and claims the benefit of priority from prior Japanese Patent Application No. 2008-130568, filed on May 19, 2008, the entire contents of which are incorporated herein by reference.

BACKGROUND

In recent years, in accordance with miniaturization of a semiconductor element, a method of forming a pattern having a dimension smaller than a resolution limit of lithography (threshold exposure linewidth) is required. As one of such methods, a method is known in which sidewall patterns are formed on side faces of a dummy pattern (core material) and a workpiece film is etched using the sidewall patterns as a mask. This method, for example, is disclosed in JP-A-2006-303022.

According to the conventional method disclosed in JP-A-2006-303022, etc., after forming the sidewall patterns, the dummy pattern between the sidewall patterns is removed by wet etching treatment, thereby forming a microscopic mask composed of the sidewall patterns. Recently, further miniaturization of a pattern dimension and further improvement of dimensional precision have been required to such pattern forming methods using the sidewall patterns.

However, according to the conventional method disclosed in JP-A-2006-303022, etc., accuracy of the mask pattern may be deteriorated by the inclination of the sidewall pattern due to surface tension acting in chemical solution used for removing the dummy pattern or a stress generated in the sidewall pattern or the dummy pattern, etc.

BRIEF SUMMARY

A method of fabricating a semiconductor device according to one embodiment includes: forming a core material on a workpiece; forming a coating film comprising an amorphous material so as to cover an upper surface and side faces of the core material; crystallizing the coating film by applying heat treatment; forming a sidewall mask by removing the crystallized coating film while leaving a portion thereof located on the side faces of the core material; removing the core material after forming the sidewall mask; and etching the workpiece using the sidewall mask as a mask after removing the core material.

A method of fabricating a semiconductor device according to another embodiment includes: forming a core material on a workpiece; forming a coating film comprising an amorphous material so as to cover an upper surface and side faces of the core material; forming a sidewall mask by removing the coating film while leaving a portion thereof located on the side faces of the core material; crystallizing the sidewall mask by applying heat treatment; removing the core material after crystallizing the sidewall mask; and etching the workpiece using the sidewall mask as a mask after removing the core material.

A method of fabricating a semiconductor device according to another embodiment includes: forming a core material on a workpiece; forming a coating film comprising an amorphous material so as to cover an upper surface and side faces of the core material; forming a stress film including a compressive stress on the coating film, and crystallizing the coating film by heat applied at the time of forming the stress film; applying etching to the coating film and the stress film, thereby forming a sidewall mask on side faces of the core material, the sidewall mask comprising the coating film and the stress film thereon; removing the core material after forming the sidewall mask; and etching the workpiece using the sidewall mask as a mask after removing the core material.

DETAILED DESCRIPTION

First Embodiment

FIGS. 1A to 1H are cross sectional views showing processes for fabricating a semiconductor device according to a first embodiment.

Figure 1A:
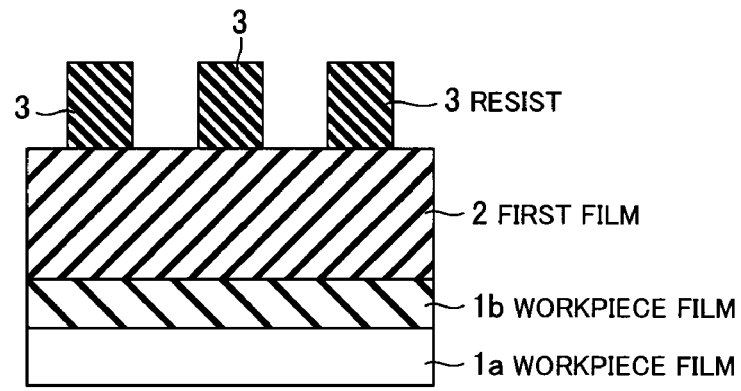
FIGS. 1A to 1H are cross sectional views showing processes for fabricating a semiconductor device according to a first embodiment.

Firstly, as shown in FIG. 1A, a first film 2 is formed on workpiece films 1a and 1b, which are deposited on a non-illustrated semiconductor substrate, by a LPCVD (Low-Pressure Chemical Vapor Deposition) method, etc. And then, a resist 3 having a predetermined pattern is formed on the first film 2.

Here, the workpiece films 1a and 1b are, e.g., a gate material film or a hard mask on an object to be processed. Alternatively, the workpiece films 1a and 1b may be a film composed of plural layers, e.g., a control electrode film, an interelectrode insulating film and a floating gate electrode film composing a stack gate structure of a flash memory. Furthermore, the semiconductor substrate itself may be an object to be processed (workpiece).

In addition, the first film 2 is made of TEOS (Tetraethoxysilane), $SiO_2$, SiN or C, etc., and a film thickness thereof is determined based on a selectivity of the workpiece film 1b with respect to a sidewall mask 7 formed in a posterior process, etc. Note that, depending on material properties of the first film 2, after forming a film for ensuring an etching selectivity to the resist 3 on the first film 2, the resist 3 may be pattern-formed thereon.

In addition, the resist 3 is made of, e.g., polycrystalline Si. In this case, the resist 3 is formed by patterning using a lithography method and a RIE (Reactive Ion Etching) method after forming a polycrystalline Si film by the LPCVD method. In addition, a predetermined pattern of the resist 3 is, e.g., line-and-space.

Figure 1B:
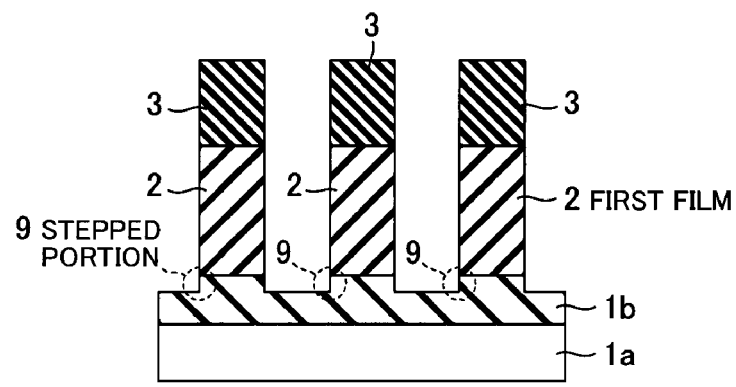

Next, as shown in FIG. 1B, the pattern is transferred by applying etching to the first film 2 using the resist 3 as a mask. At this time, the etching is also applied to the workpiece film 1b until a trench with a predetermined depth is formed. As a result, a region having the core material formed thereon and stepped portions 9 formed in other regions are formed in the workpiece film 1b. Here, the predetermined depth is a depth that does not adversely affect a posterior process shape even though it is preferably deeper than a depth of a trench formed by unintentional removal of the workpiece film 1b due to a problem of processing accuracy, etc., at the time of applying etching to the first film 2.

Figure 1C:
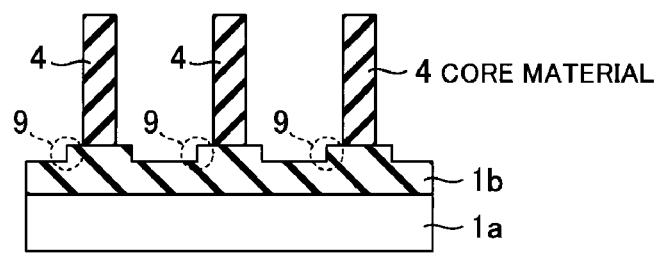

Next, as shown in FIG. 1C, slimming treatment is applied to the first film 2 for narrowing the width, thereby being shaped into a core material 4. As a result, the width of the core material 4 can be made to be thinner than the resolution limit of the lithography. Note that, the resist 3 is removed by $O_2$ plasma etching, etc., before or after the slimming treatment.

Here, the sliming treatment is carried out by wet etching, dry etching, or a combination of the wet etching and the dry etching. Then, the stepped portion 9 in the workpiece film 1b is exposed by the slimming treatment.

Figure 1D:
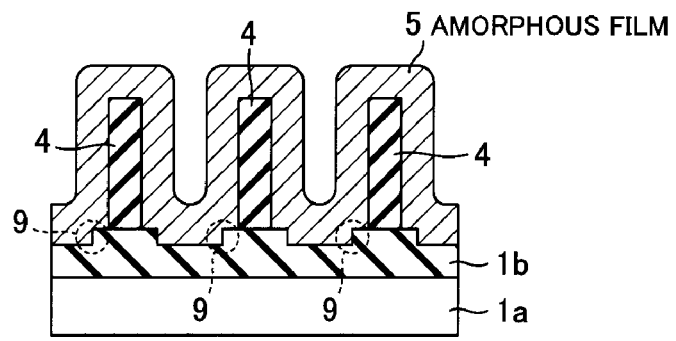

Next, as shown in FIG. 1D, an amorphous film 5 is formed by a CVD (Chemical Vapor Deposition) method, etc., so as to conformally cover an upper surface and side faces of the core material 4. Here, the amorphous film 5 is made of an amorphous material such as amorphous Si or amorphous alumina, etc.

Figure 1E:
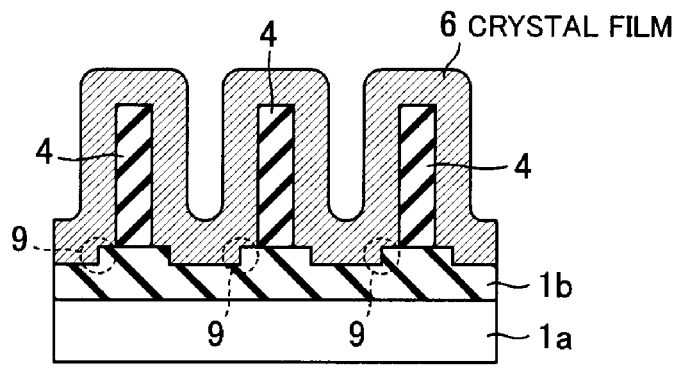

Next, as shown in FIG. 1E, the amorphous film 5 is crystallized by applying heat treatment, thereby being transformed into a crystal film 6. Since the amorphous film 5 is crystallized and transformed into the crystal film 6, a compressive stress is generated in the crystal film 6.

Here, for example, when the amorphous film 5 is amorphous Si, the amorphous film 5 is crystallized by the heat treatment at about 600° C. or more and is transformed into polycrystalline Si as the crystal film 6. Furthermore, the heat treatment is preferably carried out at about 650° C. or more in order to effectively crystallize the amorphous film 5 that is amorphous Si. In addition, the upper limit of the heat treatment temperature may be a temperature that does not adversely affect other members on the semiconductor device, e.g., may be about 950° C. which is a temperature not deteriorating film quality of a gate oxide film.

Meanwhile, when the amorphous film 5 is amorphous alumina, the amorphous film 5 is crystallized by the heat treatment at about 900° C. or more and is transformed into polycrystalline alumina as the crystal film 6. In addition, the upper limit of the heat treatment temperature may be a temperature that does not adversely affect other members on the semiconductor device, e.g., may be about 950° C. which is a temperature not deteriorating film quality of a gate oxide film. The polycrystalline alumina in this case is often transformed into $\gamma$-$Al_2O_3$ having a spinel type structure.

Figure 1F:
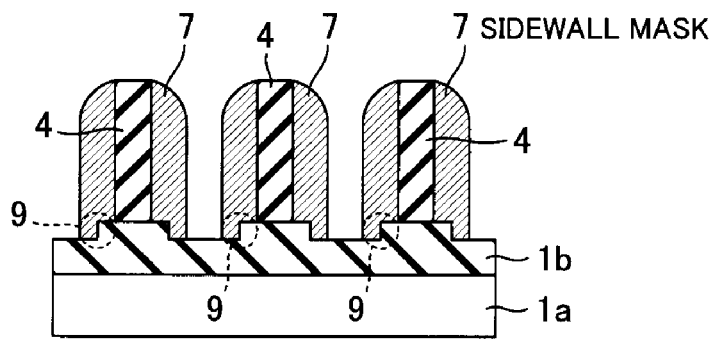

Next, as shown in FIG. 1F, the crystal film 6 is removed by the RIE method, etc., while leaving a portion thereof located on the side faces of the core material 4, which results in that the sidewall mask 7 is formed. In addition, the sidewall mask 7 is formed so as to be located on the stepped portion 9. Furthermore, similarly to the unprocessed crystal film 6, the sidewall mask 7 includes a compressive stress.

Figure 1G:
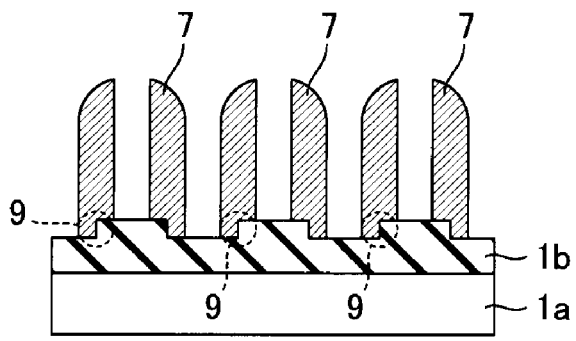

Next, as shown in FIG. 1G, the core material 4 is removed by wet etching, etc. Note that, when the core material 4 has a line-and-space pattern, since the sidewall mask 7 formed on the side faces of each core material 4 has a ring pattern, it is possible to transform the pattern of the sidewall mask 7 into the line-and-space pattern by removing an edge of the sidewall mask 7 in a length direction of the core material 4.

When the core material 4 is removed, the chemical solution used for wet etching enter into a region where the core material 4 was formerly located, and a force gravitating towards each other acts on the sidewall masks 7 located on both sides of the region where the core material 4 was formerly located due to influence of the surface tension acting in the chemical solution, etc. However, in the present embodiment, since the compressive stress included in the sidewall mask 7 interrupts the force gravitating towards each other that acts on the sidewall masks 7 located on both sides of the region where the core material 4 was formerly located, it is possible to suppress gradient deformation of the sidewall mask 7 caused by the surface tension of the chemical solution, etc.

Figure 1H:
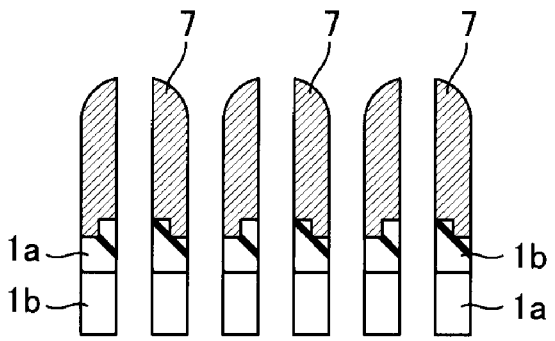

Next, as shown in FIG. 1H, the pattern of the sidewall masks 7 is transferred to the workpiece films 1a and 1b by applying etching using the sidewall masks 7 as a mask.

Figure 2A:
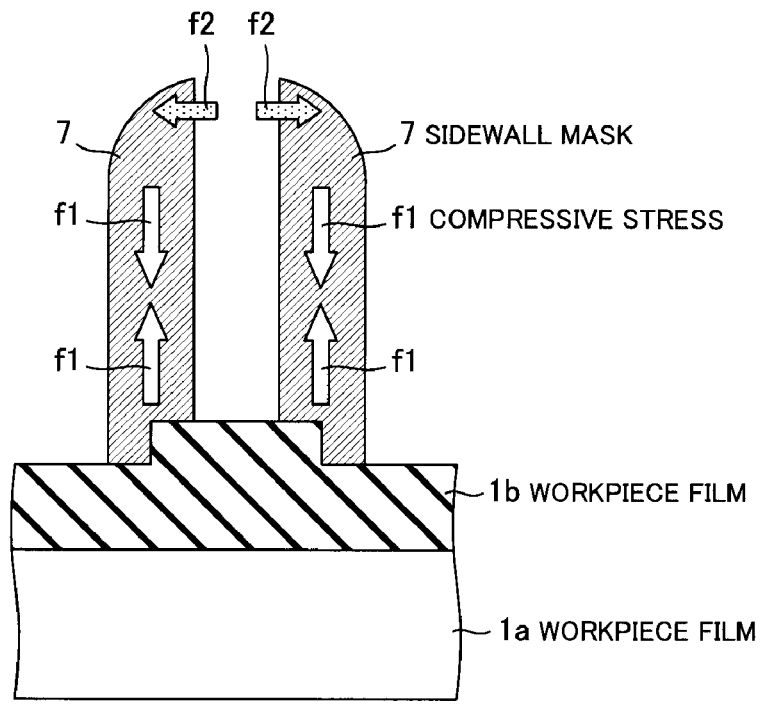
FIGS. 2A and 2B are enlarged views of FIG. 1G each showing a periphery of a sidewall mask 7 and a periphery of a stepped portion 9.

FIG. 2A is an enlarged view showing a periphery of the sidewall mask 7 of FIG. 1G. FIG. 2A schematically shows a compressive stress f1 generated by a crystallization of the amorphous film 5 and subsequent transformation into the crystal film 6. When the force gravitating towards each other acts on the sidewall masks 7 facing each other, a force f2 is generated in a direction to neutralize this force by the compressive stress f1 that acts in a height direction of the sidewall mask 7. Namely, the force f2 is a force that suppresses the gradient deformation of the sidewall mask 7. Here, a force generated at the upper edge of the sidewall mask 7 is schematically shown as the force f2.

Figure 2B:
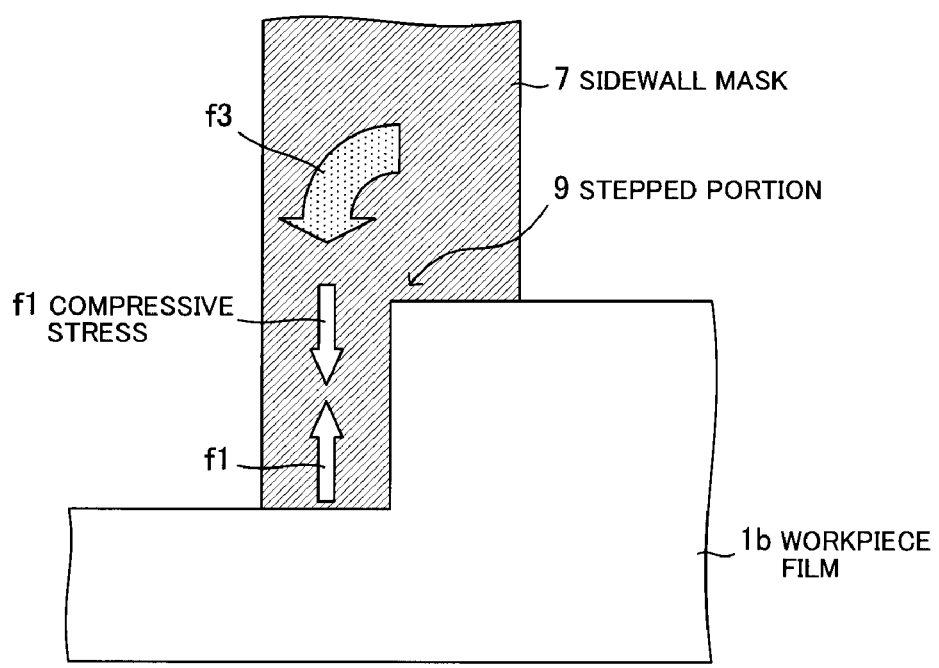

FIG. 2B is an enlarged view showing a periphery of the stepped portion 9 of FIG. 1G. The compressive stress f1 generated in a region of the sidewall mask 7 located between heights of upper and lower steps of the stepped portion 9 generates a force f3 having a component in an outer direction of the sidewall mask 7 (left side in FIG. 2B) in a region above the height of the upper step of the stepped portion 9. The force f2 generated at the upper edge of the sidewall mask 7 shown in FIG. 2A is increased by generation of the force f3. Namely, a force for suppressing the gradient deformation of the sidewall mask 7 is increased by the existence of the stepped portion 9 in the workpiece film 1b.

Figure 3:
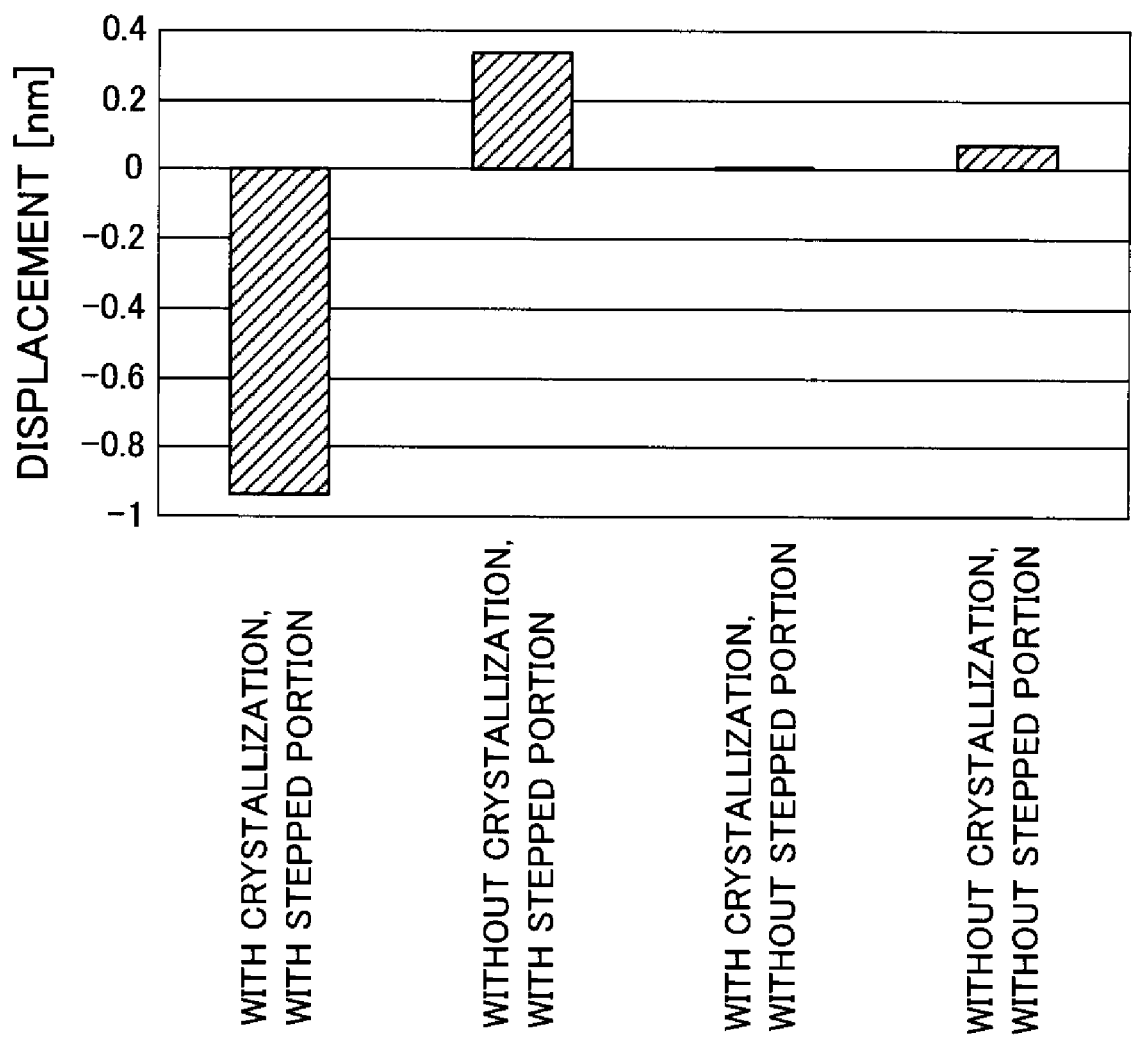
FIG. 3 is a graph showing simulation results of displacement of an upper edge of the sidewall mask 7 under each condition.

FIG. 3 is a graph showing each simulation result of displacement of an upper edge of the sidewall mask 7 in case of changing each condition of status of crystallization and presence of the stepped portion 9 of the sidewall mask 7. Note that, the displacement in the simulation means a displacement in a horizontal direction (a direction parallel to a surface of the semiconductor device). In addition, the level difference of the stepped portion 9 (a height difference between the upper and lower steps) is 15 nm in this simulation.

Here, similarly to the above described present embodiment, "with crystallization" in FIG. 3 refers to the case that the amorphous film 5 is transformed into the crystal film 6 by the crystallization and subsequently the crystal film 6 is shaped into the sidewall mask 7. In addition, "without crystallization" refers to the case that the amorphous film 5 is directly shaped into a sidewall shape without being crystallized. In addition, similarly to the above described present embodiment, "with stepped portion" refers to the case that the workpiece film 1b has the stepped portion 9. In addition, "without stepped portion" refers to the case that the workpiece film 1b does not have the stepped portion 9.

In addition, displacement [nm] in FIG. 3 indicates a displacement in an inner direction of the sidewall mask 7 (right side in FIG. 2B) in case of a positive value and a displacement in an outer direction of the sidewall mask 7 (left side in FIG. 2B) in case of a negative value. Note that, since the displacement value varies depending on the conditions such as the height of the sidewall mask 7, etc., the value shown in FIG. 3 is merely an example. However, magnitude correlation of the displacement value is same regardless of the conditions.

FIG. 3 shows that, similarly to the present embodiment, an outward displacement of the sidewall mask 7 is large under the condition of "with crystallization" and "with stepped portion", i.e., when the force gravitating towards each other acts on the sidewall masks 7 facing each other, the force acting in a direction to neutralize this force is larger. Note that, the reason why the displacement value is positive under the other conditions is that the force to gravitate the sidewall masks 7 facing each other could not be neutralized when the simulation was carried out taking this force into consideration.

Figure 4:
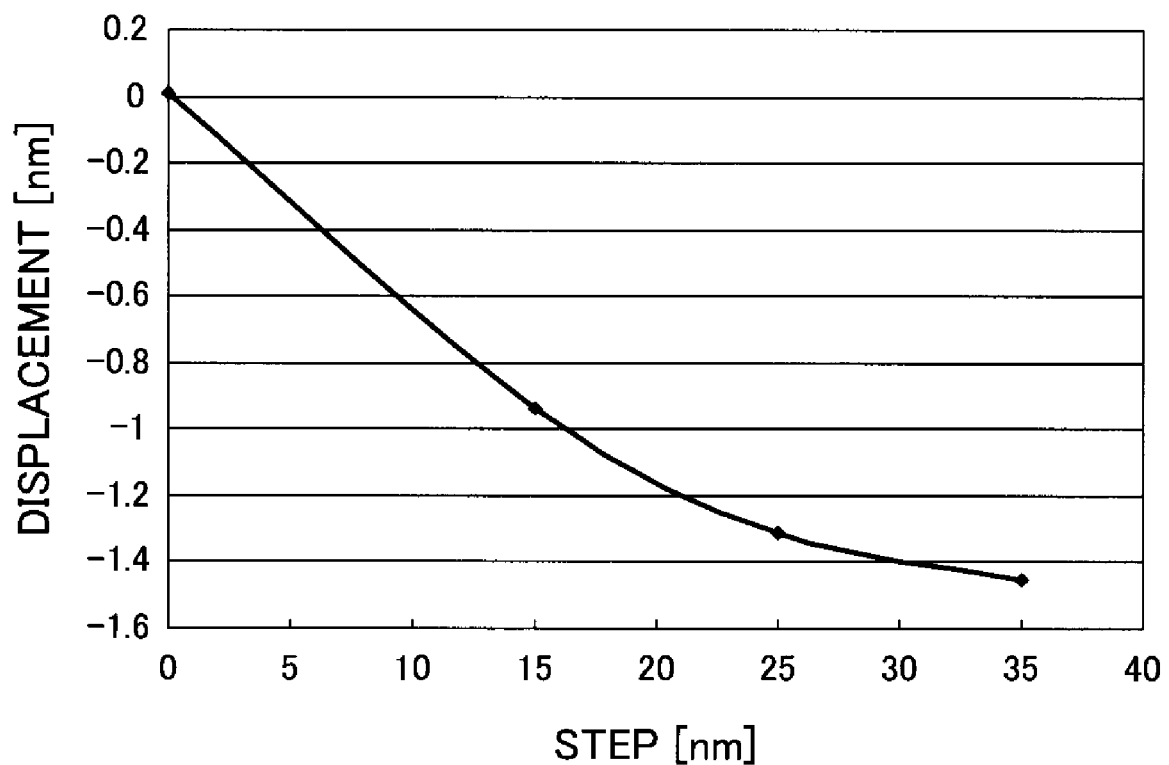
FIG. 4 is a graph showing each simulation result of displacement of the upper edge of the sidewall mask 7 when a level difference of the stepped portion 9 is varied.

FIG. 4 is a graph showing each simulation result of displacement of the upper edge of the sidewall mask 7 when a level difference of the stepped portion 9 is varied. Note that, the displacement in the simulation results of FIG. 4 is synonymous with that of FIG. 3.

FIG. 4 shows that the larger the level difference of the stepped portion 9, the larger the outward displacement of the sidewall mask 7, i.e., when the force gravitating towards each other acts on the sidewall masks 7 facing each other, the force acting in a direction to neutralize this force increases. Note that, since the displacement value varies depending on the conditions such as the height of the sidewall mask 7, etc., the value shown in FIG. 4 is merely an example. However, the tendency, which the displacement of the upper edge of the sidewall mask 7 increases as the level difference of the stepped portion 9 increases, is same regardless of the conditions.

Figure 5:
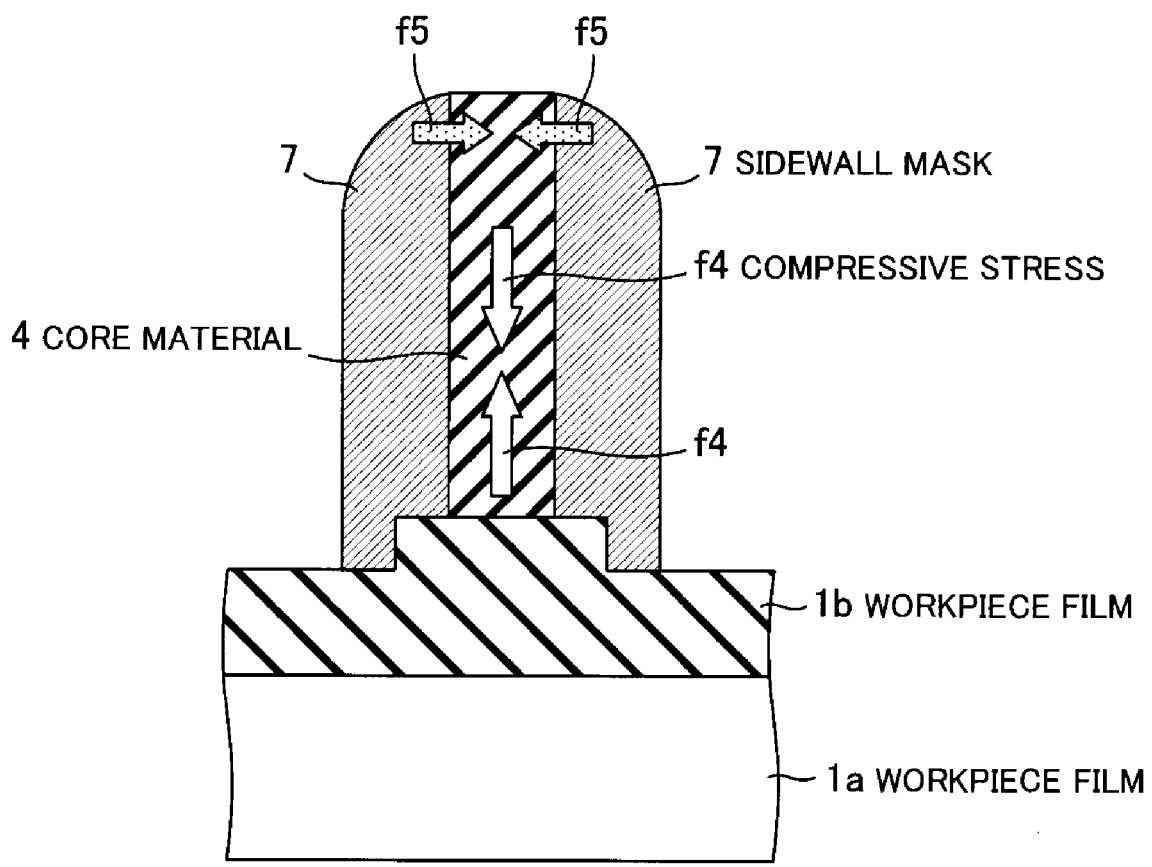
FIG. 5 is a schematic view of a force acting on the sidewall mask 7 when a core material 4 includes a compressive stress f4.

FIG. 5 is a schematic view of a force acting on the sidewall mask 7 when the core material 4 includes a compressive stress f4. In the process of crystallizing the amorphous film 5 by applying heat treatment for transforming the amorphous film 5 into the crystal film 6 shown in FIG. 1E, when the compressive stress f4 is generated in the core material 4, a force f5 gravitating the upper portion of the sidewall mask 7 toward the core material 4 side is generated in the sidewall mask 7 on the both side faces of core material 4. Since the force f5 weakens the force f2 that is generated by the compressive stress f1 in the sidewall mask 7, a material of which compressive stress f4 generated by the heat treatment is as small as possible is preferably used for a material of the core material 4.

In addition, when the magnitude of the compressive stress f4 varies depending on the heat treatment temperature, the heat treatment temperature is preferably a temperature by which the compressive stress f4 is reduced. For example, when TEOS is used as the material of the core material 4, the force f5 is maximized at the heat treatment temperature of about 700° C. and the force f5 decreases according to increase of the heat treatment temperature. Therefore, when TEOS is used as the material of the core material 4, it is possible to reduce the compressive stress f4 by increasing the heat treatment temperature as much as possible.

Therefore, as for the heat treatment temperature, it is preferable to select a temperature by which the magnitude of the force f1 in the sidewall mask 7 (preferably large) and the magnitude of the compressive stress f4 in the core material 4 (preferably small) are well-balanced. When amorphous Si is used as a material of the amorphous film 5 (the sidewall mask is polycrystalline Si) and TEOS is used as the material of the core material 4, it is preferable to carry out the heat treatment at 750-850° C.

Effect of the First Embodiment

According to the first embodiment, by forming the sidewall mask 7 including a compressive stress, it is possible to suppress the gradient deformation of the sidewall mask 7, and thereby accurately transferring the pattern including a microscopic line-and-space pattern to the workpiece films 1a and 1b.

In addition, it is possible to suppress the gradient deformation of the sidewall mask 7 more effectively by forming the stepped portion 9 in the workpiece film 1b.

Second Embodiment

The present embodiment is different from the first embodiment in the timing of crystallizing the amorphous film 5. Note that, the explanation will be omitted or simplified for the points same as the first embodiment.

Figure 6A:
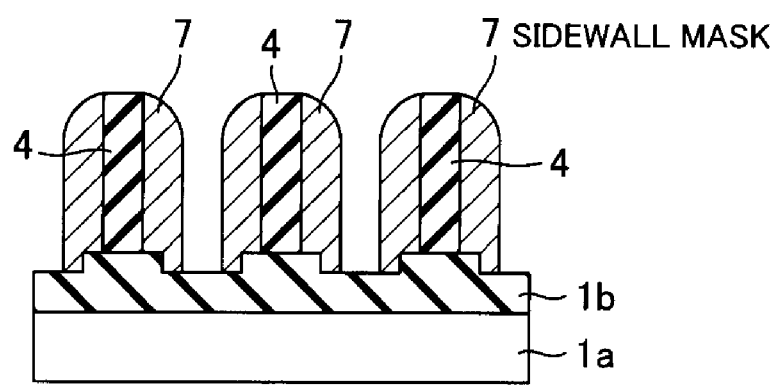
FIGS. 6A and 6B are cross sectional views showing processes for fabricating a semiconductor device according to a second embodiment.
Figure 6B:
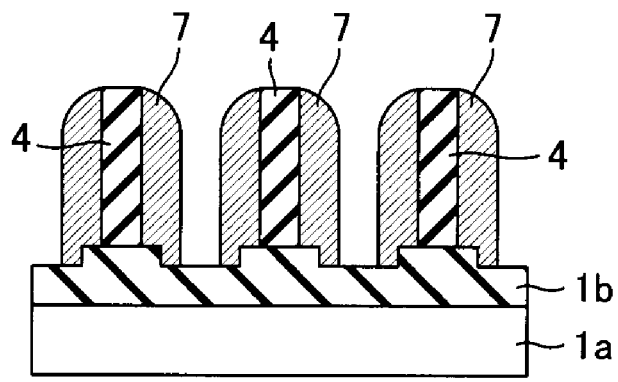

FIGS. 6A and 6B are cross sectional views showing processes for fabricating a semiconductor device according to the second embodiment.

Firstly, the processes until the process, shown in FIG. 1D, for forming the amorphous film 5 are carried out in the same way as the first embodiment.

Next, as shown in FIG. 6A, the amorphous film 5 is removed by the RIE method, etc., while leaving a portion thereof located on the side faces of the core material 4, which results in that the sidewall mask 7 is formed.

Next, as shown in FIG. 6B, the sidewall mask 7 is crystallized by applying heat treatment. A compressive stress is generated in the sidewall mask 7 by crystallizing the sidewall mask 7.

Subsequently, the processes after the process, shown in FIG. 1G, for removing the core material 4 are carried out in the same way as the first embodiment.

Effect of the Second Embodiment

According to the second embodiment, it is possible to obtain the same effect as the first embodiment even when the sidewall mask 7 is formed by crystallizing the amorphous film 5 after shaping the amorphous film 5 into a sidewall shape.

Third Embodiment

The present embodiment is different from the first embodiment in that a stress film is formed on the side face of the sidewall mask 7. Note that, the explanation will be omitted or simplified for the points same as the first embodiment.

Figure 7A:
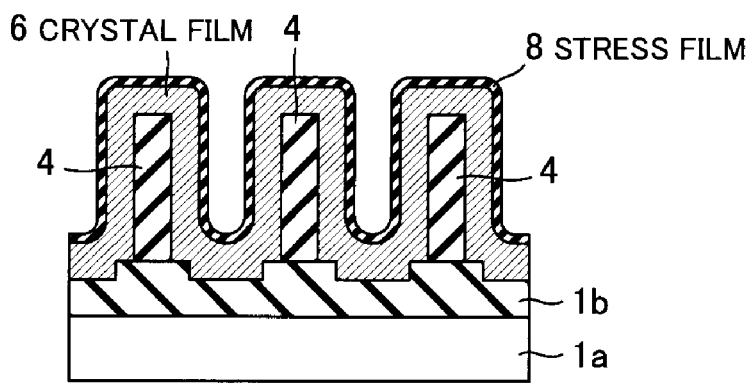
FIGS. 7A and 7B are cross sectional views showing processes for fabricating the semiconductor device according to the second embodiment.
Figure 7B:
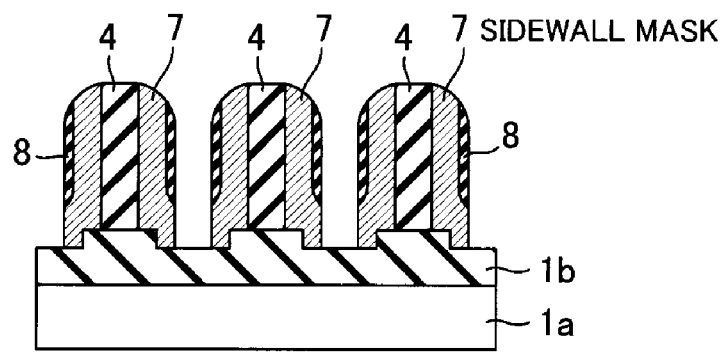

FIGS. 7A and 7B are cross sectional views showing processes for fabricating the semiconductor device according to the second embodiment.

Firstly, the processes until the process, shown in FIG. 1D, for forming the amorphous film 5 are carried out in the same way as the first embodiment. Note that, since the sum of the thickness of the amorphous film 5 and that of a below-described stress film 8 is substantially same as a width of the sidewall mask 7 in the present embodiment, the thickness of the amorphous film 5 is preferably determined taking this point into consideration.

Next, as shown in FIG. 7A, the stress film 8 is formed on the amorphous film 5 by the LPCVD method, etc. Here, the amorphous film 5 is crystallized and transformed into the crystal film 6 by heat applied at the time of forming the stress film 8. Since the amorphous film 5 is crystallized and transformed into the crystal film 6, a compressive stress is generated in the crystal film 6. Note that, the stress film 8 is a film, such as a SiN film, etc., including a compressive stress. When the amorphous film 5 is made of amorphous Si, the amorphous film 5 is crystallized and then transformed into the crystal film 6 by forming the stress film 8 under the temperature condition of 600° C. or more, preferably 650° C. or more. Meanwhile, when amorphous film 5 is made of amorphous alumina, the amorphous film 5 is crystallized and then transformed into the crystal film 6 by forming the stress film 8 under the temperature condition of 900° C. or more. Note that, in either case, the upper limit of the heat treatment temperature for forming the stress film 8 may be a temperature that does not adversely affect other members on the semiconductor device, e.g., may be about 950° C. which is a temperature not deteriorating film quality of a gate oxide film.

Next, as shown in FIG. 7B, the crystal film 6 and the stress film 8 are removed by the RIE method, etc., while leaving a portion thereof located on the side faces of the core material 4, thereby being shaped into a sidewall shape. As a result, the sidewall mask 7 having the stress film 8 on the side face thereof is obtained.

Subsequently, the processes after the process, shown in FIG. 1G, for removing the core material 4 are carried out in the same way as the first embodiment.

Figure 8:
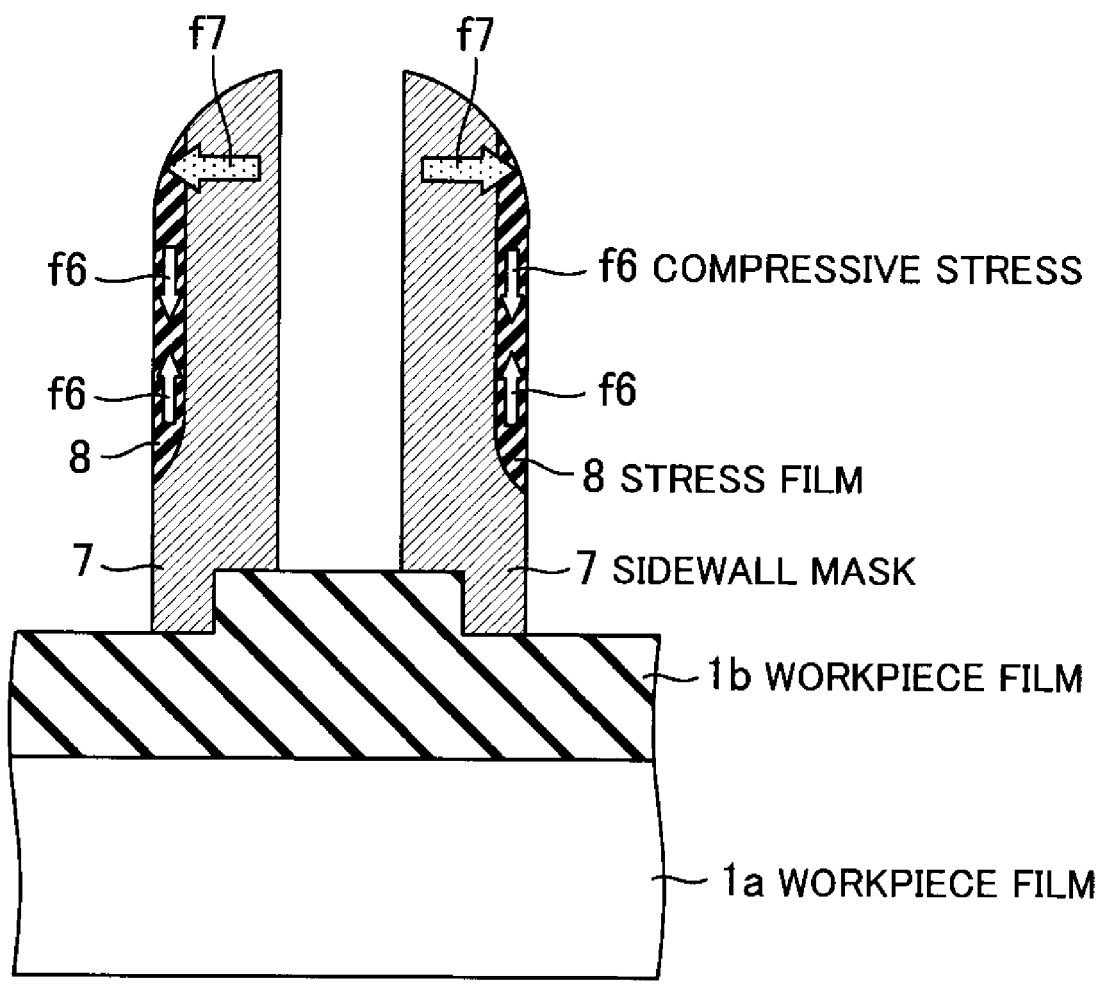
FIG. 8 is an enlarged view showing a periphery of the sidewall mask 7 of the semiconductor device according to a third embodiment.

FIG. 8A is an enlarged view showing the periphery of the sidewall mask 7 according to the present embodiment. A force 7$f$ outwardly pulling the upper portions of the sidewall masks 7 facing each other is generated by a compressive stress f6 acting on the stress film 8. Since the force 7$f$ acts in addition to the force 2$f$ that is generated by the compressive stress f1 in the sidewall mask 7, it is possible to suppress the gradient deformation of the sidewall mask 7 more effectively.

Effect of the Third Embodiment

According to the third embodiment, by forming the sidewall mask 7 so as to have a structure having the stress film 8 on the side face thereof, it is possible to suppress the gradient deformation of the sidewall mask 7 more effectively, thereby accurately transferring the pattern including a microscopic line-and-space pattern to the workpiece films 1$a$ and 1$b$.

Other Embodiments

It should be noted that the present invention is not intended to be limited to the above-mentioned first to third embodiments, and the various kinds of changes thereof can be implemented by those skilled in the art without departing from the gist of the invention.

For example, instead of the amorphous film 5, it is possible to use a film made of a crystal of which crystalline phase is transformed by heat treatment. When a compressive stress is generated in the crystal by crystalline phase transition, it is possible to form the sidewall mask 7 including a compressive stress by using such a crystal.

Furthermore, it is possible to arbitrarily combine the configurations of the above-mentioned first to third embodiments without departing from the gist of the invention.

What is claimed is:

1. A method of fabricating a semiconductor device, comprising:
    forming a core material on a workpiece, the forming the core material including:
        forming a material film of the core material on the workpiece,
        removing a predetermined portion of the material film and a portion of the workpiece located immediately under the predetermined portion of the material film, and
        applying a slimming process to the material film from which the predetermined portion thereof has been removed, so as to form level differences in regions of the workpiece exposed on both sides of the core material by forming the core material;
    forming a coating film comprising an amorphous material so as to cover an upper surface and side faces of the core material;
    crystallizing the coating film by applying heat treatment;
    forming a sidewall mask on the side faces of the core material and on the level differences in regions of the workpiece by removing the crystallized coating film while leaving a portion thereof located on the side faces of the core material;
    removing the core material after forming the sidewall mask; and
    etching the workpiece using the sidewall mask as a mask after removing the core material.

2. The method of fabricating a semiconductor device according to claim 1, wherein
    the coating film comprises amorphous Si; and
    the coating film is transformed from amorphous Si into polycrystalline Si by applying the heat treatment to the coating film under conditions of about 600-950° C.

3. The method of fabricating a semiconductor device according to claim 2, wherein
    the core material comprises TEOS; and
    the coating film is transformed from amorphous Si into polycrystalline Si by applying the heat treatment to the coating film under a condition of about 750-850° C.

4. The method of fabricating a semiconductor device according to claim 1, wherein
    the coating film comprises amorphous alumina; and
    the coating film is transformed from amorphous alumina into γ-$Al_2O_3$ by applying the heat treatment to the coating film under a condition of about 900-950° C.

5. The method of fabricating a semiconductor device according to claim 1, wherein a compressive stress is generated in the coating film by crystallizing the coating film.

6. The method of fabricating a semiconductor device according to claim 1, wherein
    the core materials having a line-and-space pattern are formed;
    the sidewall masks having a ring pattern are formed;
    the pattern of the sidewall mask is transformed into a line-and-space pattern by removing an edge of the sidewall mask in a length direction of the core materials; and
    the workpiece is etched using the sidewall masks having a line-and-space pattern as a mask.

7. A method of fabricating a semiconductor device, comprising:
    forming a core material on a workpiece, the forming the core material including:
        forming a material film of the core material on the workpiece, removing a predetermined portion of the material film and a portion of the workpiece located immediately under the predetermined portion of the material film, and applying a slimming process to the material film from which the predetermined portion thereof has been removed, so as to form level differences in regions of the workpiece exposed on both sides of the core material by forming the core material;

forming a coating film comprising an amorphous material so as to cover an upper surface and side faces of the core material;

forming a sidewall mask on the side faces of the core material and on the level differences in regions of the workpiece by removing the coating film while leaving a portion thereof located on the side faces of the core material;

crystallizing the sidewall mask by applying heat treatment;

removing the core material after crystallizing the sidewall mask; and etching the workpiece using the sidewall mask as a mask after removing the core material.

8. The method of fabricating a semiconductor device according to claim 7, wherein the coating film comprises amorphous Si; and the sidewall mask is transformed from amorphous Si into polycrystalline Si by applying the heat treatment to the sidewall mask under a condition of about 600-950° C.

9. The method of fabricating a semiconductor device according to claim 8, wherein the core material comprises TEOS; and the sidewall mask is transformed from amorphous Si into polycrystalline Si by applying the heat treatment to the sidewall mask under a condition of about 750-850° C.

10. The method of fabricating a semiconductor device according to claim 7, wherein the coating film comprises amorphous alumina; and the sidewall mask is transformed from amorphous alumina into γ-$Al_2O_3$ by applying the heat treatment to the sidewall mask under a condition of about 900-950° C.

11. The method of fabricating a semiconductor device according to claim 7, wherein a compressive stress is generated in the sidewall mask by crystallizing the sidewall mask.

12. The method of fabricating a semiconductor device according to claim 7, wherein the core materials having a line-and-space pattern are formed;

the sidewall masks having a ring pattern are formed;

the pattern of the sidewall mask is transformed into a line-and-space pattern by removing an edge of the sidewall mask in a length direction of the core materials; and the workpiece is etched using the sidewall masks having a line-and-space pattern as a mask.

13. A method of fabricating a semiconductor device, comprising:

forming a core material on a workpiece, the forming the core material including:

forming a material film of the core material on the workpiece, removing a predetermined portion of the material film and a portion of the workpiece located immediately under the predetermined portion of the material film, and applying a slimming process to the material film from which the predetermined portion thereof has been removed, so as to form level differences in regions of the workpiece exposed on both sides of the core material by forming the core material;

forming a coating film comprising an amorphous material so as to cover an upper surface and side faces of the core material;

forming a stress film including a compressive stress on the coating film, and crystallizing the coating film by heat applied at the time of forming the stress film;

applying etching to the coating film and the stress film, thereby forming a sidewall mask on the side faces of the core material and on the level differences in regions of the workpiece, the sidewall mask comprising the coating film and the stress film thereon;

removing the core material after forming the sidewall mask; and etching the workpiece using the sidewall mask as a mask after removing the core material.

14. The method of fabricating a semiconductor device according to claim 13, wherein the coating film comprises amorphous Si; and the coating film is transformed from amorphous Si into polycrystalline Si by forming the stress film under a condition of about 600-950° C.

15. The method of fabricating a semiconductor device according to claim 14, wherein the core material comprises TEOS; and the coating film is transformed from amorphous Si into polycrystalline Si by forming the stress film under a condition of about 750-850° C.

16. The method of fabricating a semiconductor device according to claim 13, wherein the coating film comprises amorphous alumina; and the coating film is transformed from amorphous alumina into γ-$Al_2O_3$ by forming the stress film under a condition of about 900-950° C.

17. The method of fabricating a semiconductor device according to claim 13, wherein a compressive stress is generated in the coating film by crystallizing the coating film.

* * * * *